United States Patent
Lien et al.

(10) Patent No.: US 11,088,711 B2
(45) Date of Patent: Aug. 10, 2021

(54) MEMORY APPARATUS AND DATA ACCESSING METHOD THEREOF

(71) Applicant: Winbond Electronics Corp., Taichung (TW)

(72) Inventors: Chuen-Der Lien, San Jose, CA (US); Chi-Shun Lin, San Jose, CA (US); Seow Fong Lim, San Jose, CA (US); Ngatik Cheung, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 56 days.

(21) Appl. No.: 16/504,349

(22) Filed: Jul. 8, 2019

(65) Prior Publication Data

US 2021/0013906 A1    Jan. 14, 2021

(51) Int. Cl.
*G06F 11/00*   (2006.01)
*G11C 29/00*   (2006.01)
*H03M 13/35*   (2006.01)
*G06F 11/10*   (2006.01)

(52) U.S. Cl.
CPC ....... *H03M 13/356* (2013.01); *G06F 11/1076* (2013.01)

(58) Field of Classification Search
CPC .................. H03M 13/356; G06F 11/1076
USPC ....... 714/764, 763, 758, 757, 772, 782, 777, 714/800, 6.24, 48, 52
See application file for complete search history.

(56) References Cited

U.S. PATENT DOCUMENTS

| 9,183,085 | B1 | 11/2015 | Northcott |
| 2012/0096328 | A1* | 4/2012 | Franceschini ....... G06F 11/1048 714/758 |
| 2013/0047056 | A1 | 2/2013 | Hsu et al. |
| 2013/0198587 | A1 | 8/2013 | Kim et al. |
| 2014/0136927 | A1 | 5/2014 | Li et al. |
| 2016/0350187 | A1 | 12/2016 | Saliba |
| 2020/0106461 | A1* | 4/2020 | Graumann .......... H03M 13/154 |
| 2020/0127685 | A1* | 4/2020 | Chen ..................... G11C 29/52 |

FOREIGN PATENT DOCUMENTS

| TW | 201001426 | 1/2010 |
| TW | 201423756 | 6/2014 |
| TW | I512452 | 12/2015 |

OTHER PUBLICATIONS

"Office Action of Taiwan Counterpart Application", dated Jul. 30, 2020, p. 1-p. 4.

* cited by examiner

*Primary Examiner* — Christine T. Tu
(74) *Attorney, Agent, or Firm* — JCIPRNET

(57) ABSTRACT

The invention provides a data accessing method for a memory apparatus. The data accessing method includes: performing a reading operation on the memory apparatus based on an address information to obtain a codeword and an indicator, where the indicator corresponds to the codeword; enabling a first error correction code (ECC) operation or second ECC operation to be operated on the codeword for generating an error corrected data, wherein, the first ECC operation corrects less bits than the second ECC operation.

16 Claims, 3 Drawing Sheets

MEMORY APPARATUS AND DATA ACCESSING METHOD THEREOF

BACKGROUND OF THE INVENTION

Field of the Invention

The invention relates to a memory apparatus and a data accessing method thereof, and particularly relates to the memory apparatus with multiple error correction code (ECC) schemes.

Description of Related Art

In the conventional art, for a non-volatile memory, one ECC scheme such as BCH operation is operated on each of codewords. But, in statistic, most codewords only need zero or small number of correction bits. That is, in the conventional art, memory apparatus always uses highest power to read or write each of the codewords due to the only one ECC scheme even though most of the codewords don't need to. Furthermore, in the conventional art, parity bits need to switch maximum number of times for the only one ECC scheme even though most of the codewords don't need to.

SUMMARY OF THE INVENTION

The invention is directed to a memory apparatus and a data accessing method thereof for reducing operation power.

The invention provides the data accessing method including: performing a reading operation on the memory apparatus based on an address information to obtain a codeword and an indicator, where the indicator corresponds to the codeword; enabling a first error correction code (ECC) operation or second ECC operation to be operated on the codeword for generating an error corrected data, wherein, the first ECC operation corrects less bits than the second ECC operation.

The invention also provides the memory apparatus including a memory cells array and a controller. The controller is coupled to the memory cells array, and is configured to perform the data accessing method showing above.

According to the above descriptions, the present disclosure enables one of the first ECC operation and the second ECC operation according to the error bit number of the message bits of one codeword. That is, it is not necessary to use a maximum power to operate ECC operation on every codeword, and a power consumption of the memory apparatus can be saved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
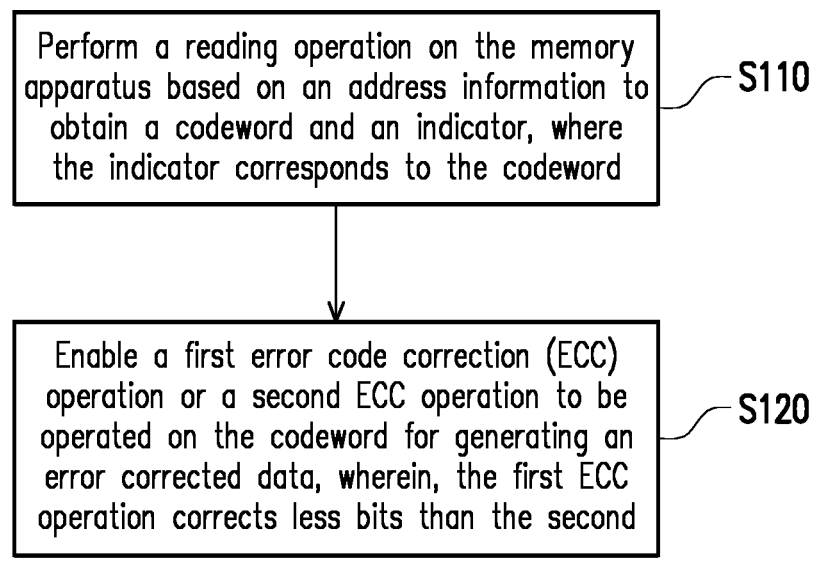
FIG. 1 illustrates a flow chart of a data accessing method according to an embodiment of presented disclosure.

Referring to FIG. 1, the data accessing method in FIG. 1 is adapted for a memory apparatus, and the memory apparatus may be a non-volatile memory, such as a flash memory. A step S110 performs a reading operation on the memory apparatus based on an address information to obtain a codeword and an indication, where the indicator corresponds to the codeword. In detail, before the reading operation being performed, a data accessing command with the address information can be received by the memory apparatus. Then, the reading operation can be operated on the memory apparatus based one the address information. In presented embodiment, there is the indicator pre-saved in the memory apparatus based on the address information. Besides, the codeword read-out by the reading operation includes a plurality of message bits and a plurality of parity bits.

A step S120 enables a first error code (ECC) operation or a second ECC operation to be operated on the codeword for generating an error corrected data according to the indicator, wherein the first ECC operation corrects less bits than the second ECC correction. In detail, one of the first ECC operation and the second ECC operation can be activated according to the indicator. For example, the indicator may be a digital signal with one bit. In presented embodiment, if the indicator is in a first logic level, the first ECC operation with less error bits correction ability can be activated, and if the indicator is in a second logic level, the second ECC operation with more error bits correction ability can be activated. The first logic level complementary to the second logic level, where the first logic level may be logic level 1, and the second logic level may be logic level 0. Of course, the first logic level is logic level 0 or 1 can be determined by a person skilled in this art, and no more limitation here.

In presented disclosure, the indicator is may be set according to a possible error bit number of the corresponding codeword, and pre-saved in the memory apparatus based on the address information. If the error bit number of the corresponding codeword is smaller than a pre-set reference, the indicator can be set to the first logic level, and if the error bit number of the corresponding codeword is not smaller than the pre-set reference, the indicator can be set to the second logic level.

It can be seen here, in presented disclosure, for each of codewords, one suitable ECC operation is activated. That is, the memory apparatus needs not always perform ECC operation on codewords with maximum power. A power consumption of the memory apparatus can be saved.

Figure 2:
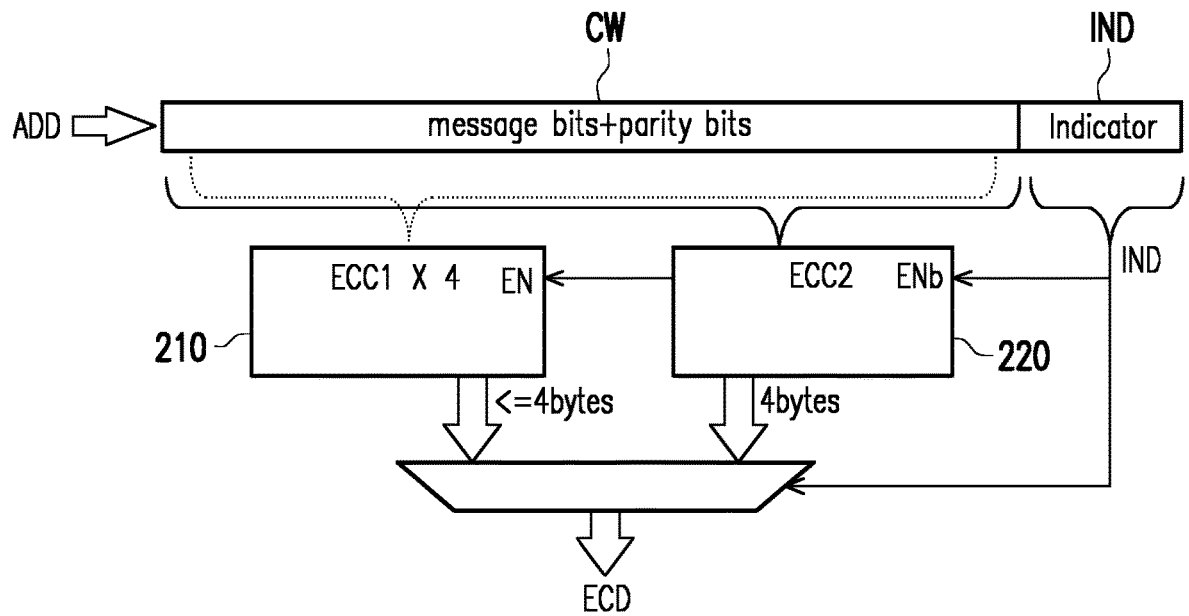
FIG. 2 illustrates a schematic diagram of the data accessing method according to another embodiment of presented disclosure.

Referring to FIG. 2, a codeword CW and a corresponding indicator IND can be read out based on an address information ADD. The codeword CW may includes a plurality of message bits and a plurality of parity bits.

On the other hand, a logic level of the indicator IND can be checked. If the indicator is logic level 1, a first ECC operation (ECC1) 210 can be activated to be operated on the codeword CW. In this embodiment, the first ECC operation 210 may be performed by a first ECC encoder, the first ECC encoder may have 4 sets, and the first ECC operation 210 may be operated based on Hamming (12, 8) code, for example.

On the contrary, if the indicator is logic level 0, a second ECC operation (ECC2) 220 can be activated to be operated on the codeword CW. In this embodiment, the second ECC operation 220 may be performed by a second ECC encoder, and the second ECC operation may be operated based on BCH (50, 32) code, for example.

In presented embodiment, the first ECC operation corrects less error bits than the second ECC operation, and the memory apparatus costs less power to perform the first ECC operation than the second ECC operation.

The memory apparatus further outputs an error corrected data ECD by selecting an output of the first ECC operation 210 or an output of the second ECC operation according to the indicator IND. In detail, if the indicator is logic level 1, the output of the first ECC operation 210 can be selected to generate the error corrected data ECD. On the contrary, if the indicator is logic level 0, the output of the second ECC operation 220 can be selected to generate the error corrected data ECD.

When a plurality of codewords are accessed, the memory apparatus can adaptively select suitable ECC operation for operating on each of the codewords. The power consumption of the memory apparatus can be saved.

Please be noted here, in some embodiment, at least one third ECC operation can be added into the data accessing flow. The third ECC operation can correct more error bits than the second ECC operation 220. In this case, the indicator IND may have 2-bits. For example, if the indicator is logic level 00, the second ECC operation can be activated; if the indicator is logic level 01, the first ECC operation can be activated; and if the indicator is logic level 10, the third ECC operation can be activated. Of course, a relationship between the indicator and the activated ECC operation can be defined by a designer of the memory apparatus, and no special limitation here.

In this embodiment, a data size of the output of the second ECC operation 220 may be 4 bytes, and a data size of the output of the first ECC operation 210 may be not larger than 4 bytes.

Figure 3:
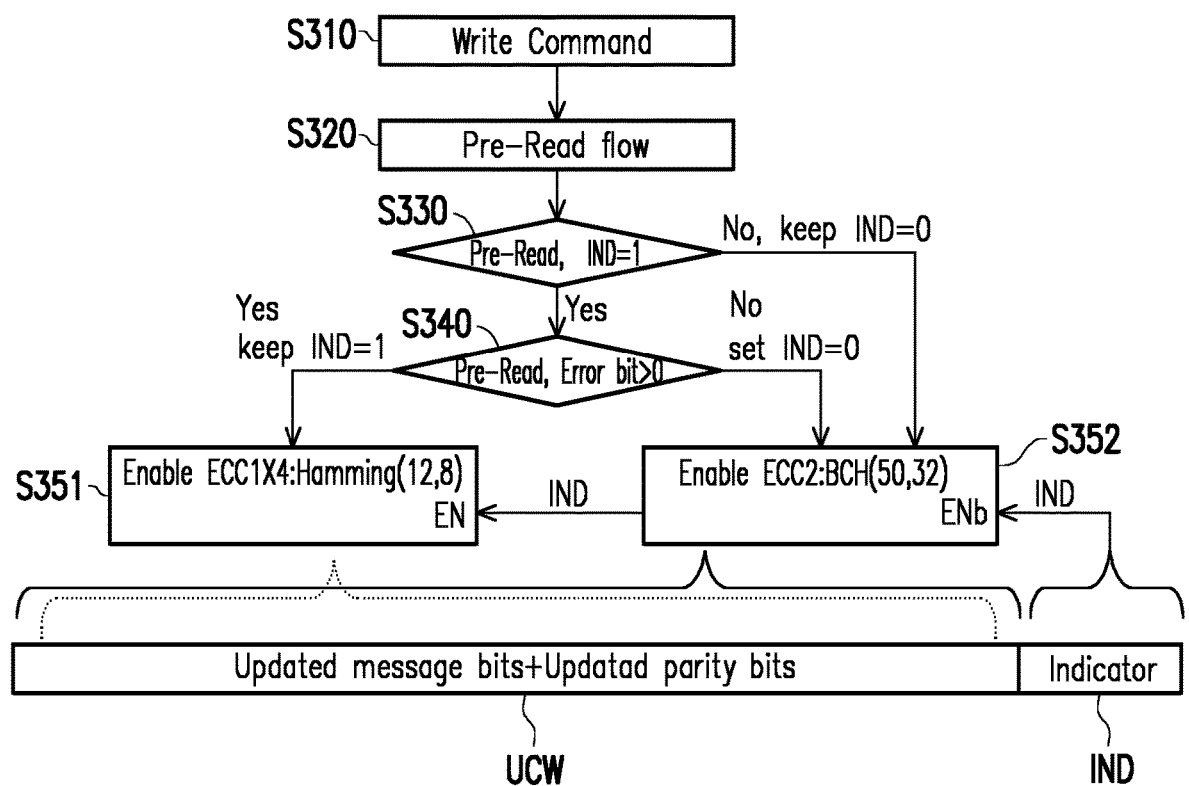
FIG. 3 illustrates a schematic diagram of the data accessing method according to another embodiment of presented disclosure.

Referring to FIG. 3, a step S310 receives a write command of a memory apparatus. Then, a step S320 performs a pre-read flow on the memory apparatus. In the pre-read flow, a read operation can be performed based on an address information of the write command, and an indicator IND can be obtained by the pre-read flow. A step S330 determines whether the indicator IND is logic level 1 or not, if the indicator IND is not logic level 1 then keeps the indicator logic level 0 and performs a step S352. On the contrary, if the indicator IND is logic level 1, a readout codeword by the pre-read operation can be checked by a write verify read flow and a number of error bit can be checked in a step S340. In the write verify read flow, a write-in codeword written into the memory apparatus is read out, and the readout codeword is compared with the write-in codeword for the write verify read flow.

If the number of the error bits equals 0, the indicator IND is kept to be logic level 1, and a step S351 is performed. On the contrary, if the number of the error bits doesn't equal 0, the indicator IND is adjusted to logic level 0, and a step S352 is performed. The step S351 enables a first ECC operation (ECC1) based on Hamming (12, 8) code when the indicator IND is logic level 1. The step S352 enables a second ECC operation (ECC2) based on BCH (50, 32) code when the indicator IND is logic level 0.

After the step S351 or the step S352 has been executed, a plurality of updated message bits and a plurality of updated parity bits may be generated, and the updated message bits and the updated parity bits form an updated codeword UCW. The updated codeword UCW and the corresponding indicator IND can be written to the memory apparatus based on the address information of the write command. The data write operation can be completed.

In here, since the indicator IND will only be written by only one time (no cycling concern), a first write pulse can be provided for writing the indicator IND to the memory apparatus, and a second write pulse can be provided for writing updated codeword UCW to the memory apparatus during the write operation, where the first write pulse is different from the second write pulse.

It should be noted here, when the updated message bits and the updated parity bits are written to the memory apparatus, the updated message bits and the updated parity bits can be respectively compared with a plurality of original message bits and a plurality of original parity bits, and the updated message bits and the updated parity bits can be written based on a less bits change scheme. The original message bits and the original parity bits can be obtained by the pre-read operation in the step S330. The less bits change scheme can be applied by a scheme well-known by a person skilled in this art, which can reduce a number of programmed memory cells in each data write operation.

Figure 4:
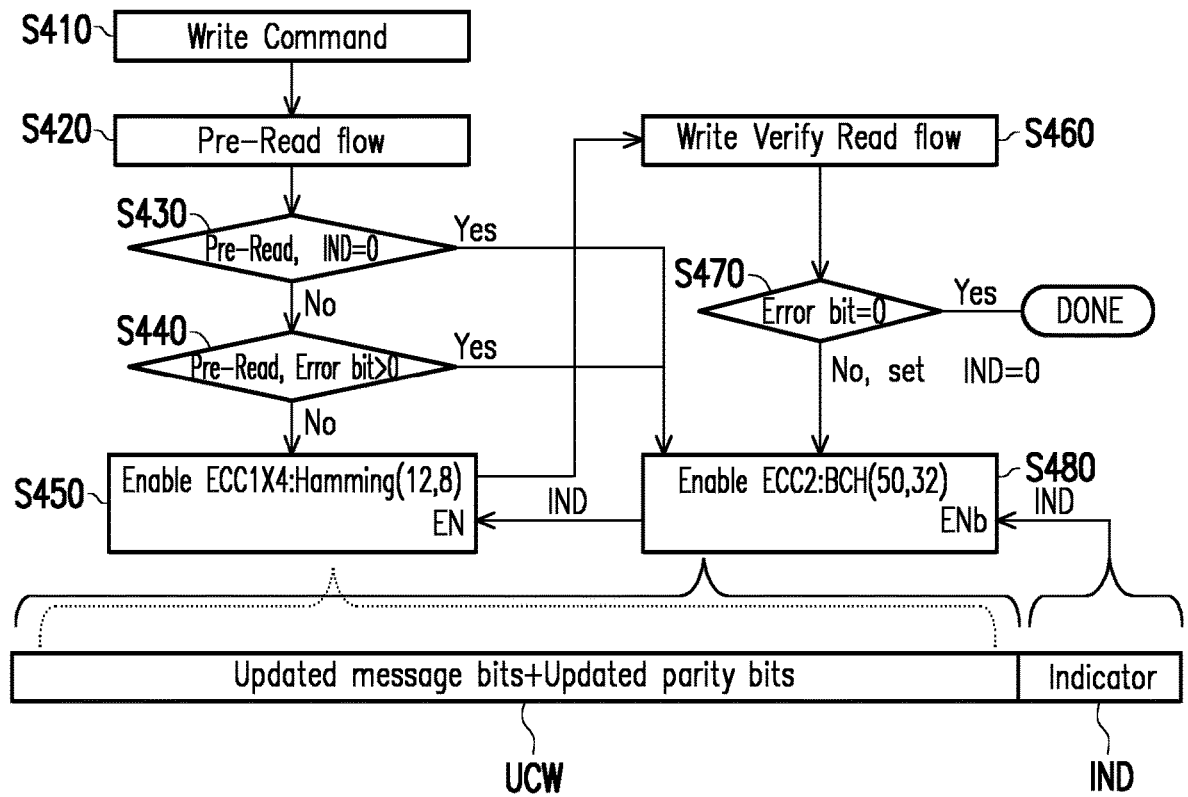
FIG. 4 illustrates a schematic diagram of the data accessing method according to another embodiment of presented disclosure.

Referring to FIG. 4, a step S410 receives a write command of a memory apparatus with an address information. Then, a step S420 performs a pre-read flow on the memory apparatus. In the pre-read flow, a read operation can be performed based on the address information of the write command, and an indicator IND can be obtained by the pre-read flow. A step S430 determines whether the indicator IND is logic level 0 or not, if the indicator IND is not logic level 0 then a step S440 is operated. On the contrary, if the indicator IND is logic level 0, a step S480 is performed.

In the step S440, if the number of the error bits is larger than 0, a step S450 is performed to enable a first ECC operation (ECC1) based on Hamming (12,8) code. If the number of the error bits is not larger than 0, a step S460 is performed.

In the step S460, a write verify read flow is performed. In the step 460, a write-in codeword written into the memory apparatus is read out, and the readout codeword is compared with the write-in codeword for the write verify read flow. If the readout codeword and the write-in codeword are the same, the write command has been finished. On the contrary, if the readout codeword and the write-in codeword are different, the step S480 is performed.

In the step S480, the indicator IND is set to be logic level 0, and the second ECC operation (ECC2) is enabled for ECC operation based on BCH (50, 32) code. The second ECC operation can correct more error bits than the first ECC operation. An accuracy of the codeword can be made sure.

After the step S450 and the step S480 have been executed, a plurality of updated message bits and a plurality of updated parity bits may be generated, and the updated message bits and the updated parity bits form an updated codeword UCW. The updated codeword UCW and the corresponding indicator IND can be written to the memory apparatus based on the address information of the write command. The data write operation can be completed. It should be noted here, when the updated message bits and the updated parity bits are written to the memory apparatus, the updated message bits and the updated parity bits can be written based on the less bits change scheme as mentioned above.

Figure 5:
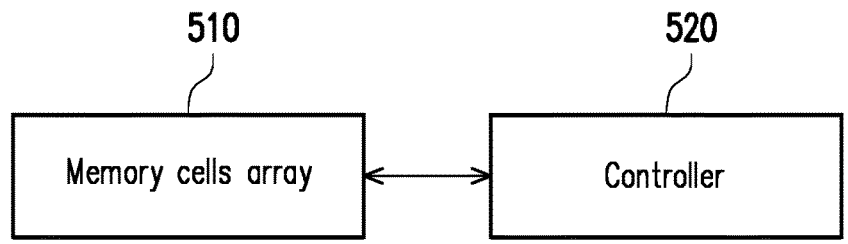
FIG. 5 illustrates a block diagram of a memory apparatus according to an embodiment of presented disclosure.

Referring to FIG. 5, the memory apparatus 500 may be a non-volatile memory. For example, the memory apparatus 500 may be a flash memory. The memory apparatus 500 includes a memory cells array 510 and a controller 520. The memory cells array 510 includes a plurality of memory cells. The controller 520 is configure to perform the steps of the data accessing method mentioned in previous embodiments. Detail operations of the steps have been described in the embodiments mentioned above, no more repeated description here.

About the controller 520. The controller 520 may be a processor having a computation function. Alternatively, the controller 520 may also be a hardware circuit designed by using hardware description language (HDL) or any digital circuit design method well known by related technicians of the field, and implemented through a field programmable gate array (FPGA), a complex programmable logic device (CPLD) or an application-specific integrated circuit (ASIC).

In summary, a power consumption of the memory apparatus can be reduced by selecting suitable ECC operation for each of the codeword. Further, by using the less bits change scheme to write the codeword, the power consumption of the memory apparatus can be further reduced, and a lift time of the memory cells (i.e. flash memory cells) can be increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data accessing method for a memory apparatus, comprising:
    performing a reading operation on the memory apparatus based on an address information to obtain a codeword and an indicator, where the indicator corresponds to the codeword;
    enabling a first error correction code (ECC) operation or second ECC operation to be operated on the codeword for generating an error corrected data, wherein,
    the first ECC operation corrects less bits than the second ECC operation,
    wherein the codeword comprises a plurality of message bits and corresponding a plurality of parity bits;
    receiving a data write command based on the address information;
    checking an error bit number of the codeword during a pre-read and a write verify read flow to obtain a checking result;
    setting the indicator according to the checking result, wherein if the error bits number equals 0, setting the indicator to a first logic level, and if the error bits number is larger than 0, setting the indicator to a second logic level, the first logic level is complementary to the second logic level;
    operating the first ECC operation or the second ECC operation on the message bits according to the indicator to generate a plurality of updated message bits and a plurality of updated parity bits; and
    performing a writing operation for writing the updated message bits, the updated parity bits and the indicator to the memory apparatus based on the address information.

2. The data accessing method as claimed in claim 1, wherein step of checking the error bit number of the codeword during the pre-read and the write verify read flow to obtain the checking result comprises:
    performing the pre-read flow based on the address information to obtain a readout codeword; and
    performing the write verify read flow on the read-out codeword to obtain the checking result.

3. The data accessing method as claimed in claim 1, wherein step of performing the writing operation for writing the updated message bits, the updated parity bits and the indicator to the memory apparatus based on the address information comprises:
    writing the updated message bits, the updated parity bits and the indicator to the memory apparatus according to the error bit number.

4. The data accessing method as claimed in claim 1, wherein the first logic level is logic level 1 and the second logic level is logic level 0, and step of operating the first ECC operation or the second ECC operation on the message bits according to the indicator comprises:
    if the indicator is logic level 1, operating the first ECC operation on the message bits; and
    if the indicator is logic level 0, operating the second ECC operation on the message bits.

5. The data accessing method as claimed in claim 1, wherein the first logic level is logic level 1 and the second logic level is logic level 0, and the data accessing method further comprising:
    performing a write verify read operation after the writing operation based on the address information when the indicator is the first logic level;
    if a checked error bits number is larger than 0, updating the indicator to the second logic level; and
    enabling and performing the second ECC operation on the updated message bits.

6. The data accessing method as claimed in claim 1, wherein the first ECC operation is operated based on Hamming code, and the second ECC operation is operated based on BCH code.

7. The data accessing method as claimed in claim 1, further comprising:
    providing a first write pulse to write the indicator to the memory apparatus during the writing operation; and
    providing a second write pulse to write the updated message bits to the memory apparatus during the writing operation,
    where the first write pulse is different from the second write pulse.

8. The data accessing method as claimed in claim 1, wherein the indicator is set according to an error bit number of the codeword during a write verify read flow.

9. A memory apparatus, comprising:
    a memory cells array; and
    a controller, coupled to the memory cells array, being configured to:
        perform a reading operation on the memory apparatus based on an address information to obtain a codeword and an indicator, where the indicator corresponds to the codeword; and
        enable a first error correction (ECC) operation or second ECC operation to be operated on the codeword for generating an error corrected data, wherein the first ECC operation corrects less bits than the second ECC operation,
    wherein the codeword comprises a plurality of message bits and corresponding a plurality of parity bits, and the controller is further configured to:

receive a data write command based on the address information;

check an error bit number of the codeword during a pre-read and a write verify read flow to obtain a checking result;

set the indicator according to the checking result, if the error bits number equals 0, set the indicator to a first logic level, if the error bits number is larger than 0, set the indicator to a second logic level, wherein the first logic level is complementary to the second logic level;

operate the first ECC operation or the second ECC operation on the message bits according to the indicator to generate a plurality of updated message bits and a plurality of updated parity bits; and performing a writing operation for writing the updated message bits, the updated parity bits and the indicator to the memory cells array based on the address information.

10. The memory apparatus as claimed in claim 9, wherein the controller is further configured to:

perform the pre-read flow based on the address information to obtain the codeword; and perform the write verify read flow on the codeword to obtain the checking result.

11. The memory apparatus as claimed in claim 9, wherein the controller writes the updated message bits, the updated parity bits and the indicator to the memory cells array according to the error bit number.

12. The memory apparatus as claimed in claim 9, wherein the first logic level is logic level 1 and the second logic level is logic level 0, and if the indicator is 1, the controller operates the first ECC operation on the message bits; if the indicator is logic level 0, the controller operates the second ECC operation on the message bits.

13. The memory apparatus as claimed in claim 9, wherein the first logic level is logic level 1 and the second logic level is logic level 0, and the controller is further configured to:

perform a write verify read operation after the writing operation based on the address information when the indicator is the first logic level;

if a checked error bits number is larger than 0, update the indicator to the second logic level; and enable and performing the second ECC operation on the updated message bits.

14. The memory apparatus as claimed in claim 9, wherein the first ECC operation is operated based on Hamming code, and the second ECC operation is operated based on BCH code.

15. The memory apparatus as claimed in claim 9, wherein the controller is further configured to:

provide a first write pulse to write the indicator to the memory apparatus during the writing operation; and provide a second write pulse to write the updated message bits to the memory apparatus during the writing operation, where the first write pulse is different from the second write pulse.

16. The memory apparatus as claimed in claim 9, wherein the controller sets the indicator according to an error bit number of the codeword.

* * * * *